United States Patent
Bach et al.

(10) Patent No.: US 8,069,198 B2
(45) Date of Patent: Nov. 29, 2011

(54) INTEGRATED CIRCUIT HAVING A FILTER CIRCUIT

(75) Inventors: Elmar Bach, Villach (AT); Stefan Groiss, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 1084 days.

(21) Appl. No.: 11/622,659

(22) Filed: Jan. 12, 2007

(65) Prior Publication Data

US 2007/0188239 A1    Aug. 16, 2007

(30) Foreign Application Priority Data

Jan. 12, 2006  (DE) .......................... 10 2006 001 673

(51) Int. Cl.
  *G06F 17/10* (2006.01)
  *G06G 7/02* (2006.01)
(52) U.S. Cl. ...................... 708/322; 708/819
(58) Field of Classification Search .......... 708/300–322, 708/819

See application file for complete search history.

(56) References Cited

U.S. PATENT DOCUMENTS

| | | | | |
|---|---|---|---|---|
| 2,931,901 A * | 4/1960 | Markusen | ........................ | 333/19 |
| 3,090,377 A * | 5/1963 | Salisbury et al. | ............. | 600/490 |
| 3,176,148 A * | 3/1965 | Lampke | .......................... | 327/59 |
| 3,216,676 A * | 11/1965 | Brown et al. | ................. | 244/195 |
| 3,579,122 A * | 5/1971 | Paine et al. | .................... | 708/300 |
| 4,170,758 A * | 10/1979 | Tamburelli | ................... | 708/323 |
| 4,435,823 A * | 3/1984 | Davis et al. | ................... | 708/323 |
| 4,468,786 A * | 8/1984 | Davis | ........................... | 708/323 |
| 4,940,977 A * | 7/1990 | Mandell | ....................... | 341/143 |
| 5,323,422 A * | 6/1994 | Ushirokawa | ................. | 708/323 |
| 6,433,626 B1 | 8/2002 | Guimaraes | | |
| 2005/0173740 A1 | 8/2005 | Jin | | |
| 2009/0237156 A1* | 9/2009 | Griffiths et al. | ................. | 330/86 |

FOREIGN PATENT DOCUMENTS

| | | |
|---|---|---|
| DE | 22 23 617 | 11/1972 |
| DE | 100 58 952 | 6/2002 |
| WO | WO 9811668 A1 * | 3/1998 |

* cited by examiner

*Primary Examiner* — Tan V Mai
(74) *Attorney, Agent, or Firm* — Dicke, Billig & Czaja, PLLC

(57) ABSTRACT

A filter circuit arrangement comprising a circuit configuration having non-linear transmission characteristics for equalizing an input signal is disclosed. In one embodiment, the circuit configuration having the non-linear transmission characteristics is provided in a feedback loop of the filter circuit arrangement.

20 Claims, 2 Drawing Sheets

INTEGRATED CIRCUIT HAVING A FILTER CIRCUIT

CROSS-REFERENCE TO RELATED APPLICATIONS

This Utility Patent Application claims priority to German Patent Application No. DE 10 2006 001 673.4 filed on Jan. 12, 2006, which is incorporated herein by reference.

BACKGROUND

The invention relates to a filter circuit arrangement.

In semiconductor devices, in particular e.g., in corresponding, integrated (analog or digital) computing circuits and/or semiconductor memory devices, as well as other electric circuits or—more generally speaking—signal-processing systems, filter circuit arrangements, e.g., high and/or low pass filter circuit arrangements, are frequently used.

A high pass is a filter circuit arrangement that transmits signals with high frequencies substantially without modification and effects attenuation and, as a rule, a phase lead with signals with low frequencies.

As compared to this, a low pass is a filter circuit arrangement in which signals with low frequencies are transmitted substantially without modification; with signals with high frequencies, attenuation and, as a rule, a phase lag is effected.

Passive high and/or low pass filter circuit arrangements has one or several resistors and—as energy storage means—one or several capacitive devices (in particular e.g., capacitors) (and/or one or several inductive devices (in particular e.g., coils)).

As compared to this, active filter circuit arrangements comprise, as a rule—apart from passive devices such as resistors and capacitors—one or several active devices, in particular operational amplifiers.

In addition to the above-mentioned filter circuit arrangements, in conventional semiconductor devices, in particular e.g., in corresponding, integrated (analog or digital) computing circuits and/or semiconductor memory devices, as well as other electric circuits or—more generally speaking—signal-processing systems, one or several—separate—equalizer circuit arrangements are frequently also provided.

The separate providing of filter and equalizer circuit arrangements, however, results in a relatively high switching effort altogether and in relatively high energy consumption.

For these and other reasons, there is a need for the present invention.

SUMMARY

One embodiment provides an integrated circuit including a filter circuit arrangement having a circuit configuration having non-linear transmission characteristics for equalizing an input signal. The circuit configuration having the non-linear transmission characteristics is provided in a feedback loop of the filter circuit arrangement.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides an integrated circuit having a novel filter circuit arrangement, in particular a circuit arrangement by which the above-mentioned and/or further disadvantages of conventional circuit arrangements can be eliminated or avoided at least partially.

In accordance with one embodiment of the invention there is provided a circuit arrangement which includes, for equalizing an input signal (S_in) (additionally) a circuit configuration having non-linear transmission characteristics.

The circuit configuration having non-linear transmission characteristics is provided in a feedback loop of the filter circuit arrangement.

In one embodiment of the invention, the feedback loop of the filter circuit arrangement includes additionally at least one integrator.

A low pass filter is provided by means of the feedback loop.

By the combination of signal equalizing and filter function achieved in the above-mentioned manner, it is possible to realize the corresponding circuit arrangement with relatively little effort and with a relatively simple and compact structure as well as with relatively low power consumption.

Figure 1:
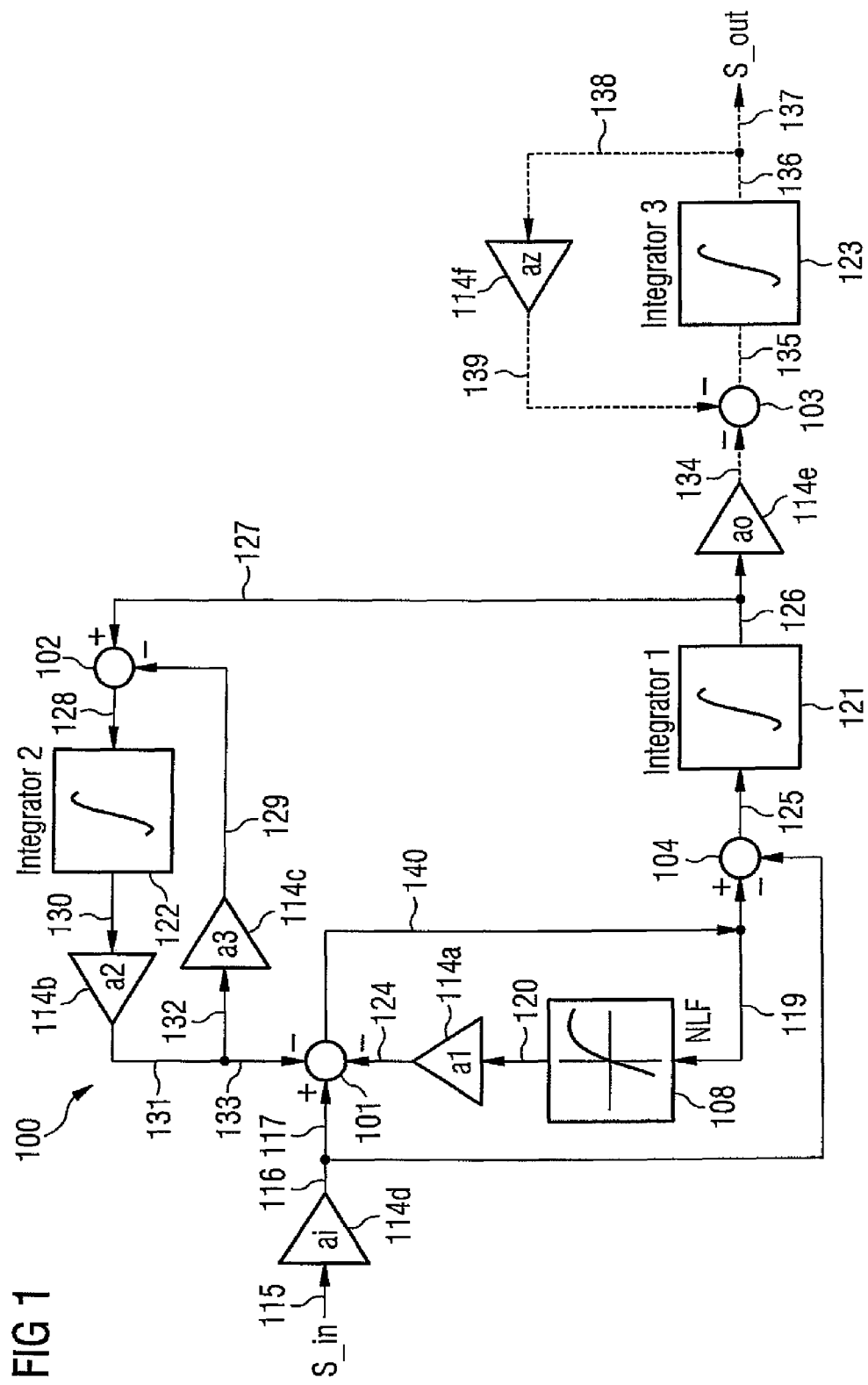
FIG. 1 illustrates a schematic, exemplary representation of a signal flow diagram of a circuit arrangement in accordance with an embodiment of the present invention.

FIG. 1 illustrates—schematically and by way of example—a signal flow diagram of a circuit arrangement 100 with filter and signal equalizing function in accordance with an embodiment of the present invention, where an electric (input) signal S_in present at a signal line 115 (e.g., a corresponding current or voltage signal, or a signal representing any other physical value) can be filtered and equalized and be output—as filtered and equalized signal S_out—at a signal line 137.

The (output) signal S_out may—like the input signal S_in—be a corresponding current or voltage signal, or a signal representing any other physical value.

As illustrated in FIG. 1, the circuit arrangement 100 includes a plurality of amplifying elements 114a, 114b, 114c, 114d, 114e (and optionally: a further amplifying element 114*f*) which may, for instance, be formed by corresponding control-oriented amplifier blocks.

The amplifying elements 114*a*, 114*b*, 114*c*, 114*d*, 114*e*, 114*f* multiply the signal present at their inputs—linearly—with a particular factor each (here: in the case of the amplifying element 114*a*—with the factor or coefficient a1,—in the case of the amplifying element 114*b*—with the factor or coefficient a2,—in the case of the amplifying element 114*c*—with the factor or coefficient a3,—in the case of the amplifying element 114*d*—with the factor or coefficient ai,—in the case of the amplifying element 114*e*—with the factor or coefficient a0, and—in the case of the amplifying element 114*f*—with the factor or coefficient az).

The amplifying elements 114*d*, 114*e* fulfill, with the amplifying factors or coefficients ai, a0, in the signal path of the signal flow diagram illustrated in FIG. 1 a pure multiplier function and may—in alternative embodiments—also be omitted.

As results further from FIG. 1, the circuit arrangement 100 includes a plurality of subtraction elements 101, 102, 104 (as well as optionally: a further subtraction element 103), and a plurality of integrators 121, 122 (as well as optionally: a further integrator 123), and a non-linear function block 108 having non-linear transmission characteristics.

The integrators 121, 122, 123 may, for instance, be corresponding linear integrators which integrate the signal present at their respective inputs over time.

In accordance with FIG. 1, in the present embodiment the electric signal S_in that is present at the signal line 115 is supplied to the input of the amplifying element 114*d*.

The signal output at the output of the amplifying element 114*b*—and amplified by the factor ai vis-à-vis the input signal S_in—is, via signal lines 116, 117, supplied to a plus input of the subtraction element 101 and—via the signal line 116 and a signal line 118—to a minus input of the subtraction element 104.

The signal output at the output of the amplifying element 114*b*—and amplified by the factor a2 vis-à-vis the signal input in the amplifying element 114*b*—is, via a signal line 131 and a signal line 133, supplied to a first minus input of the subtraction element 101 and, via the signal line 131 and a signal line 132, to an input of the amplifying element 114*c*.

Correspondingly, the signal output at the output of the amplifying element 114*a*—and amplified by the factor a1 vis-à-vis the signal input in the amplifying element 114*a*—is, via a signal line 124, supplied to a second minus input of the subtraction element 101.

The subtraction element 101 subtracts the above-mentioned signal that is present at the signal line 133 (i.e. at the first minus input of the subtraction element 101) and the above-mentioned signal that is present at the signal line 124 (i.e. at the second minus input of the subtraction element 101) from the above-mentioned signal that is present at the signal line 117 (i.e. at the plus input of the subtraction element 101).

The signal output at the output of the subtraction element 101 at a signal line 140 is supplied to a plus input of the subtraction element 104 and, via a signal line 119, to an input of the non-linear function block 108 having non-linear transmission characteristics.

The signal output at the output of the non-linear function block 108 is, via a signal line 120, supplied to the amplifying element 114*a* and—as already mentioned—amplified by the factor a1, and the amplified signal is, via the signal line 124, supplied to the second minus input of the subtraction element 101.

The subtraction element 104 subtracts the above-mentioned signal that is present at the signal line 118 (i.e. at the minus input of the subtraction element 104) from the above-mentioned signal that is present at the signal line 140 (i.e. at the plus input of the subtraction element 104).

The signal output at the output of the subtraction element 104 at a signal line 125 is supplied to the input of the first integrator 121.

The signal output at the output of the integrator 121—and integrated over time vis-à-vis the signal input in the integrator 121—is, in the present embodiment, supplied, via a signal line 126, to the amplifying element 114*e* and, via the signal line 126 and the signal line 127, to a plus input of the subtraction element 102.

The signal output at the output of the amplifying element 114*c*—and amplified by the factor a3 vis-à-vis the signal input in the amplifying element 114*c*—is, via a signal line 129, supplied to a minus input of the subtraction element 102.

The subtraction element 102 subtracts the above-mentioned signal that is present at the signal line 129 (i.e. at the minus input of the subtraction element 102) from the above-mentioned signal that is present at the signal line 127 (i.e. at the plus input of the subtraction element 102).

The signal output at the output of the subtraction element 102 at a signal line 128 is supplied to the input of the second integrator 122.

The signal output at the output of the integrator 122—and integrated over time vis-à-vis the signal input in the integrator 122—is, in the present embodiment, supplied to the amplifying element 114*b* via a signal line 130.

The signal output at the output of the amplifying element 114*b*—and amplified by the factor a2 vis-à-vis the signal input in the amplifying element 114*b*—is—as already explained—supplied, via the signal lines 131, 133, to the first minus input of the subtraction element 101, and via the signal lines 131, 132 to the amplifying element 114*c*.

The signal supplied to the amplifying element 114*e* via the signal line 126, as explained above, is amplified by the factor a0 by the amplifying element 114*e*, and the amplified signal is, via a signal line 134, supplied to a first minus input of the subtraction element 103.

The signal output at the output of the amplifying element 114*f*—and amplified by the factor az vis-à-vis the signal input in the amplifying element 114*f*—is, via a signal line 139, supplied to a second minus input of the subtraction element 103.

The subtraction element 103 adds the—negated—signal present at the signal line 134 (i.e. at the first minus input of the subtraction element 103) and the—negated—signal present at the signal line 139 (i.e. at the second minus input of the subtraction element 103).

The signal output at the output of the subtraction element 103 at a signal line 135 is supplied to the input of the third integrator 123.

The signal output at the output of the integrator 123—and integrated over time vis-à-vis the signal input in the integrator 123—is, in embodiment illustrated, supplied, via a signal line 136 and a signal line 138, to the amplifying element 114*f* and—as output signal S_out—via the signal line 136 to a signal line 137.

In the embodiment illustrated in FIG. 1, a double pole system capable of resonance is formed by means of the integrators 121, 122 positioned in the main loop.

The integrators 121, 122 positioned in the main loop can—each independently—effect a phase shift of up to 90°, and—jointly—a phase shift of up to 180°.

The main loop including the integrators 121, 122 operates in accordance with the countercoupling principle: The feedback of the signal present at the signal line 133 at the first summation point of the main loop, i.e. at the subtraction element 101, is—for reasons of stability—performed with a negative sign.

Using the main loop there is formed a low pass filter of second order with an attenuation degree adjustable via the filter coefficients.

From the (input) signal S_in that is present at the signal line 115 (or the signal obtained therefrom and amplified by the factor ai—and present at the signal line 117) and the fed-back main loop signal (i.e. the signal present at the signal line 133), an input signal is formed for the non-linear function block 108—having non-linear transmission characteristics—, namely the signal output by the subtraction element 101 at the signal line 140, wherein the output signal of the non-linear function block 108 is (after a corresponding amplification by the factor a1) again returned subtractively to the first summation point of the main loop, i.e. to the above-mentioned subtraction element 101.

Using the filter coefficient a1 of the amplifying element 114a there may be controlled how great the influence of the non-linear function block 108—having non-linear transmission characteristics—is to be, i.e. the influence of the non-linear portion of the circuit arrangement 100. If the filter coefficient a1 of the amplifying element 114a is relatively small, the non-linear system implemented by the circuit arrangement 100 behaves similar to a corresponding similar linear system.

The present circuit arrangement 100 is i.e. the circumstance that the non-linear function block 108 influences the system at the very first summation point of the main loop, which results in that the output signal of the non-linear function block 108 which is non-linear in the amplitude does not directly influence the output of the circuit arrangement 100, so that a good signal equalization can be achieved (since otherwise the entire output signal S_out would be afflicted with non-linear fractions).

In the present circuit arrangement 100—via the non-linear function block 108—an equalization of the input signal S_in is first of all provided for, and subsequently the equalized signal is additionally "smoothed" by the above-mentioned low pass filter implemented by the main loop.

Using the (filter) coefficient a3 of the amplifying element 114c there may—optionally—be achieved that the transmission function of the main loop includes a zero point in addition to the above-mentioned double pole.

In this case, the corresponding zero point may be eliminated by the (optionally) additionally provided additional loop (illustrated in dashed line in FIG. 1) including the integrator 123 and the amplifying element 114f.

If the circuit arrangement 100 illustrated in FIG. 1 or the filter/equalizing principle implemented thereby, respectively, is used in the signal processing of signal pulses generated by magnetic disc writing/reading heads.

Such signal pulses are generally distorted; their positive and negative amplitudes are generally unlike.

By means of the non-linear function block 108, the negative and positive amplitudes of the signal pulses may be trimmed, so that the corresponding signal can be equalized.

By the subsequent low pass filtering of the signal—equalized in the above-mentioned manner—achieved by the above-mentioned low pass filter, higher harmonic frequency shares of the signal are removed, and thus the above-mentioned signal "smoothing" is achieved.

By means of the combination of signal equalization and filter function obtained in the above-mentioned manner, a real circuit implementing the filter/equalizing principle illustrated in FIG. 1 can be realized with relatively little effort and with a relatively simple and compact structure, as well as relatively little energy consumption.

The relatively simple and compact structure additionally also results from the fact that only one energy storage means (integrator) may be provided per filter order.

The filter principle illustrated by FIG. 1 may—instead in analog filters as explained here—alternatively also be implemented correspondingly in digital filters (wherein the integrators 121, 122, 123 are, for instance, replaced by corresponding incrementors/decrementors with a counting process width that is proportional to the input value of the counter and the analog amplifying elements 114a, 114b, 114c, 114d, 114e, 114f representing the filter coefficients a1, a2, a3, ai, a0, az, for instance, by digital multipliers, and the non-linear function block 108 by a digital look up table or a digital computing circuit).

In the following there is illustrated, by the detailed representation of a circuit arrangement 200 illustrated in FIG. 2 and implementing the filter/equalizing principle illustrated in FIG. 1, how the individual ones of the above-mentioned filter coefficients ai, a0, az, a1, a2, and a3 are related to circuit-relevant parameters of a real circuit arrangement—here: the circuit arrangement 200 illustrated in FIG. 2.

As results from FIG. 2, the circuit arrangement 200 illustrated there includes four n-channel field effect transistors 202, 203, 204, 205 (transistor T1, transistor T2, transistor TQ1, and transistor T5), and two p-channel field effect transistors 227, 228 (transistor TQ2 and transistor TC), a plurality of capacitors 254, 206 (here: the capacitors C1, C2), a non-linear circuit configuration 208 (cf. below), and—optionally—a plurality of further transistors (here: the n-channel field effect transistors 222, 223 (transistors T4 and T3)), and a further capacitor 207 (here: the capacitor C3).

The drain of the n-channel field effect transistor 202 is, via a line 209, connected with the source of the n-channel field effect transistor 205, and with the non-linear circuit configuration 208 that is connected to the ground.

The gate of the n-channel field effect transistor 205 is connected with an (input) line 211.

The drain of the n-channel field effect transistor 205 is, via a line 210, connected with the drain of the p-channel field effect transistor 227 (the source of which is connected to the supply voltage and the gate of which is connected to a signal G2), and with the source of the p-channel field effect transistor 228.

The gate of the n-channel field effect transistor 202 is, via a line 212, connected with the capacitor 206 which is, via lines 213, 214, connected with the source of the n-channel field effect transistor 202 and, via the line 213 and a line 216, with the drain of the n-channel field effect transistor 203.

The source of the n-channel field effect transistor 203 is connected to the ground.

Furthermore, the gate of the n-channel field effect transistor 203 is, via a line 218, connected to the capacitor 254—that is connected to the ground—, and to the drain of the n-channel field effect transistor 204 (the source of which is connected to the ground and the gate of which is connected to a signal G1) and, via the line 218 and a line 240, to the drain of the p-channel field effect transistor 228.

The gate of the n-channel field effect transistor 223 is, via a line 241, connected to the drain of the n-channel field effect transistor 204, to the drain of the p-channel field effect transistor 228, and to the capacitor 254 and the gate of the n-channel field effect transistor 203.

The source of the n-channel field effect transistor 223 is connected to the ground.

The drain of the n-channel field effect transistor 223 is, via a line 217, connected to the source of the n-channel field effect transistor 222, and to the capacitor 207.

The gate of the n-channel field effect transistor 222 is, via a line 246, connected to the capacitor 207 and, via the line 246 and a line 243, to the capacitor 206, and via the lines 246, 243, 212 to the gate of the n-channel field effect transistor 202.

The drain of the n-channel field effect transistor 222 is, via a line 245, connected to a load resistor 250.

The load resistor 250 is generally connected with the (positive) supply voltage or with a voltage that determines the direct voltage value (operating point) of an output voltage U_out that can be tapped at the line 245.

Figure 2:
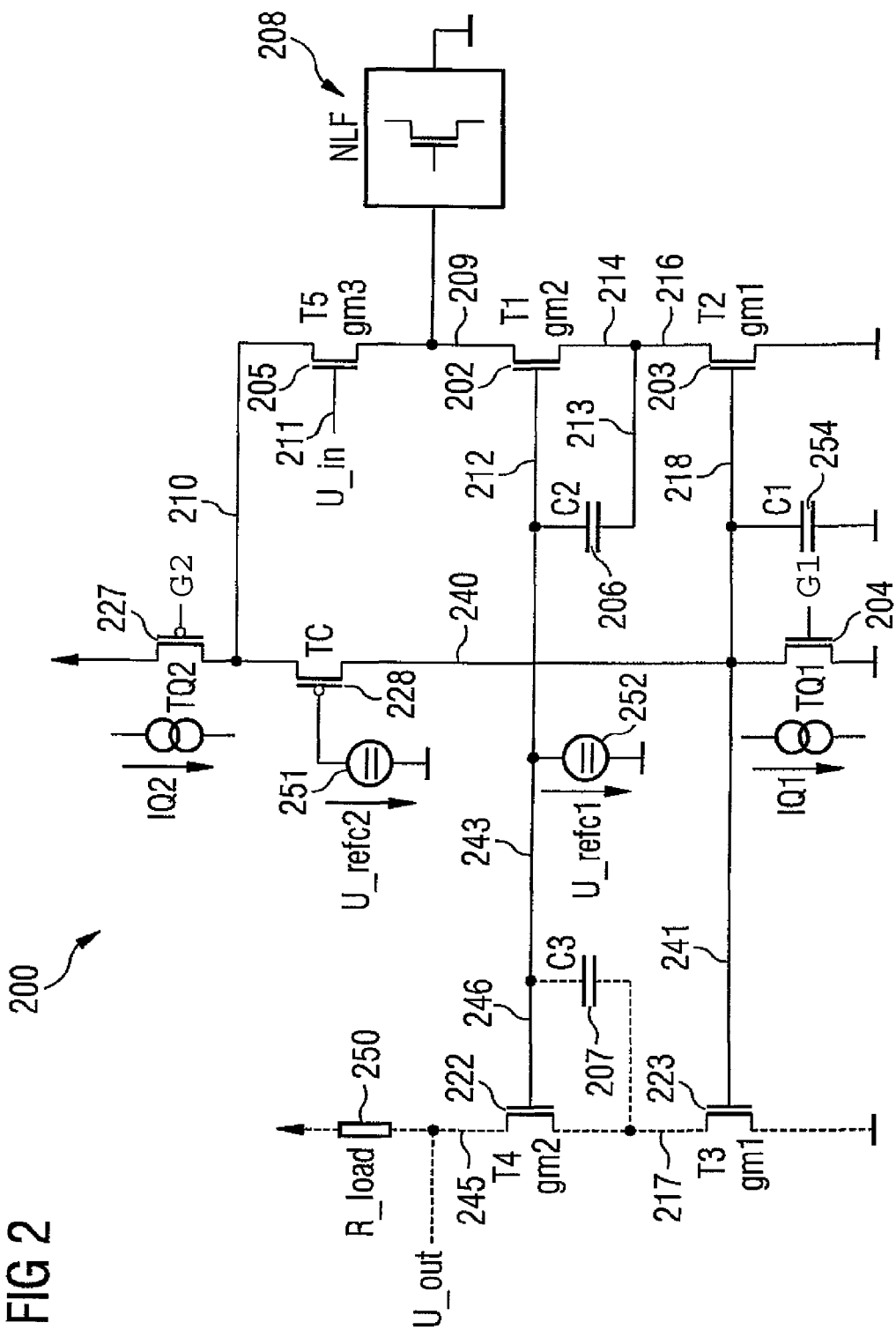
FIG. 2 illustrates a schematic, exemplary detailed representation of a circuit arrangement implementing the filter/equalizing principle illustrated in FIG. 1.

As results from FIG. 2, the gate of the p-channel field effect transistor 228 is biased to a voltage U_refc2 by means of a voltage source 251.

Furthermore, the gate of the n-channel field effect transistor 202 (and the gate of the n-channel field effect transistor 222) are biased to a voltage U_refc1 by means of a voltage source 252.

The non-linear circuit configuration 208 may be designed as a simple transistor circuit—including one or several, e.g., two, three, or more than three transistors—that may have any non-linear function or transmission characteristics NFL between input and output signal, e.g., between applied voltage and current flowing through the circuit configuration 208.

The circuit configuration 208 may—for equalizing corresponding magnetoresistive signals—, for instance, be designed as a circuit configuration having a combination of linear and square transmission characteristics.

In the circuit arrangement 200 illustrated in FIG. 2, a voltage U_in applied at the above-mentioned line 211 at the gate of the n-channel field effect transistor 205 serves as input signal.

The input voltage U_in is, via the n-channel field effect transistor 205 (transistor T5) and the non-linear circuit configuration 208, converted to a corresponding signal current that is further transmitted via the n-channel field effect transistors 202 and 203 (transistors T1, T2).

The p-channel field effect transistor 227 (transistor TQ2) acts as a current source (current IQ2). Such a current source may—in alternative embodiments that are not illustrated here—also be designed or configured correspondingly differently than illustrated in FIG. 2.

The p-channel field effect transistor 228 (transistor TC) serves as a cascode to keep the node connected with the line 210 or the drain of the field effect transistor 205, respectively, on a predefined potential.

As results further from FIG. 2, the n-channel field effect transistor 204 (transistor TQ1) acts as a current sink (current IQ1). Such a current sink may—in alternative embodiments that are not illustrated here—also be designed or configured correspondingly differently than illustrated in FIG. 2. The n-channel field effect transistors 205 or 202, 203, respectively (transistors T5 or T1, T2, respectively) are thus flown through by a current that results from the difference between the above-mentioned currents IQ2 and IQ1.

By the biasing of the n-channel field effect transistor 202 (transistor T1) by means of the voltage source 252—as mentioned above already—the gate thereof is kept constantly on the above-mentioned voltage U_refc1.

The n-channel field effect transistors 202 (transistor T1) acts as a cascode.

The field effect transistors 205, 202, 203, 204, 227, and 228 (transistors T5, T1, T2, TQ1, TQ2, and TC) form a closed loop that has a very high amplification.

Within this loop, a complex double pole is formed by the capacity C1 of the capacitor 254, the capacity C2 of the capacitor 206, and the steepnesses gm3, gm1, gm2 of the drain source currents of the field effect transistors 205, 203, 202.

In the circuit arrangement illustrated in FIG. 2, the n-channel field effect transistors 222, 223 (transistors T4, T3) and the load resistor 250 are not cogently necessary for the actual filter function. They serve to uncouple and further process the output signal (here: the voltage U_out that can be tapped at the line 245).

Due to this, on the one hand, the possibility of a cascading of filter blocks can be achieved in a simple manner (i.e. the possibility of connecting in series a plurality of (identical or similar) circuit arrangements corresponding to the circuit arrangement 200 illustrated in FIG. 2. On the other hand, linear signal amplification may be realized.

The filter coefficients ai, a0, az, a1, a2, a3 mentioned above in connection with FIG. 1 and the circuit arrangement 100 illustrated there are associated with the circuit parameters of the circuit arrangement 200 illustrated in FIG. 2 as follows:

$$ai=1$$

$$a0=gm1gm3/(C1C2)$$

$$az=gm2/C2$$

$$a1=1/gm3$$

$$a2=gm1gm2/(C1C2)$$

$$a3=C1/gm1$$

C1 is the capacity of the capacitor 254, C2 the capacity of the capacitor 206, gm1 the steepness of the drain source current of the field effect transistor 203 or 223, respectively, gm2 the steepness of the drain source current of the field effect transistors 202 or 222, respectively, and gm3 the steepness of the drain source current of the field effect transistor 205.

The resonance frequency of the double pole system results therefrom as follows:

$$f_0 = \frac{1}{2\pi} \sqrt{\frac{gm1gm2gm3R1}{C1C2(1+gm3R1)}}$$

and the attenuation as follows:

$$\zeta = \frac{1}{2} \sqrt{\frac{gm2C1(1+gm2R1)}{gm1C2gm3R1}}$$

The resistance R1 is symbolically contained in the above-mentioned formulae; it stands substantially for the derivation of the voltage after the current in the zero point or the operating point, respectively, of the above-mentioned non-linear function NLF implemented by the circuit configuration 208.

Due to the use of passive devices (here: the capacitors 206, 207, 254) as energy storage means, the circuit arrangement 200 illustrated in FIG. 2 can be realized in a relatively simple manner.

For adjusting appropriate values for gm1, gm2, or gm3 and/or C1 or C2, any analog or digital circuits may, on principle, be used; in particular for adjusting the capacities C1 or C2 is the use of appropriate digital circuits of advantage (by means of which the corresponding values can be programmed digitally).

In particular in applications in which the filter circuit arrangement 200 is embedded in major systems is a simple digital programming of the filter characteristics of great benefit.

In an alternative variant of the circuit arrangement 200, the transistors provided there may—instead as in the above-explained embodiment in NMOS or PMOS technology—e.g., also be designed in bipolar or BiCMOS technology.

Alternatively, a complementary circuit implementation is, for instance, also conceivable, in which PMOS transistors are used instead of NMOS transistors, and vice versa NMOS transistors instead of PMOS transistors.

In further, alternative variants, a plurality (e.g., two, three, or more) of the filter circuit arrangements 200 illustrated in FIG. 2 may be connected in series (cascading).

Furthermore, alternatively to the circuit arrangement 200 illustrated in FIG. 2, a circuit structure that is based on differential signals may also be used. For this purpose, in addition to a circuit arrangement corresponding to the circuit arrangement 200 illustrated in FIG. 2, a further circuit arrangement 200'—that is constructed in a mirror-inverted symmetrical manner to the circuit arrangement 200 illustrated in FIG. 2 (and otherwise identical)—may be used.

The circuit configuration 208 implementing the above-mentioned non-linear function NLF may then be connected symmetrically between the source connection of the n-channel field effect transistor 205 of the circuit arrangement corresponding to the circuit arrangement 200 and the source connection of the n-channel field effect transistor 205'—that is provided symmetrically thereto—of the circuit arrangement 200' that is symmetrical to the circuit arrangement 200.

By that, the signal path is indeed basically not changed. Fluctuations caused by temperature and manufacturing can, however, be offset (even) better.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a filter circuit including a circuit configuration having non-linear transmission characteristics for equalizing an input signal;
   a feedback loop, wherein the circuit configuration having the non-linear transmission characteristics is provided in the feedback loop,
   wherein the feedback loop of the filter circuit additionally comprises at least one integrator, and
   wherein the integrator is formed by a capacitor and a transistor.

2. The circuit according to claim 1, wherein the feedback loop of the filter circuit comprises at least two integrators.

3. The circuit according to claim 1, comprising wherein, via the feedback loop, a low pass filter is provided, the low pass filter being of second order with double pole.

4. The circuit according to claim 1, comprising:
   wherein the circuit configuration having the non-linear transmission characteristics is provided in a further loop provided in the feedback loop of the filter circuit.

5. The circuit according to claim 1, comprising where the circuit is configured such that a signal output by the circuit configuration having non-linear transmission characteristics, or a signal obtained therefrom, is subtracted from the input signal or a signal obtained therefrom.

6. The circuit according to claim 1, further comprising:
   a memory device electrically coupled to the filter circuit.

7. The circuit according to claim 1, comprising where the memory device is a semiconductor memory device.

8. The circuit according to claim 1, further comprising a signal processing system.

9. A filter circuit arrangement comprising:
   a circuit configuration having non-linear transmission characteristics for equalizing an input signal;
   a feedback loop, wherein the circuit configuration having the non-linear transmission characteristics is provided in the feedback loop,
   wherein the feedback loop of the filter circuit arrangement additionally comprises at least one integrator, and
   wherein the integrator is formed by a capacitor and a transistor.

10. The filter circuit arrangement according to claim 9, wherein the feedback loop of the filter circuit arrangement comprises at least two integrators.

11. The filter circuit arrangement according to claim 10, comprising:
    an additional integrator provided in an additional loop, configured to eliminate the additional zero point.

12. The filter circuit arrangement according to claim 9, comprising wherein, via the feedback loop, a low pass filter is provided, the low pass filter being of second order with double pole.

13. The filter circuit arrangement according to claim 12, wherein a transmission function of the low pass filter additionally comprises a zero point.

14. The filter circuit arrangement according to claim 9, comprising:
    wherein the circuit configuration having the non-linear transmission characteristics is provided in a further loop provided in the feedback loop of the filter circuit arrangement.

15. The filter circuit arrangement according to claim 9, comprising where the arrangement is configured such that a signal output by the circuit configuration having non-linear transmission characteristics, or a signal obtained therefrom, is subtracted from the input signal or a signal obtained therefrom.

16. The filter circuit arrangement according to claim 15, comprising:
    an amplifying element for generating the signal obtained from the signal output by the circuit configuration having non-linear transmission characteristics.

17. The filter circuit arrangement according to claim 16, comprising:
    a further amplifying element for generating the signal obtained from the input signal.

18. The filter circuit arrangement according to claim 9, comprising no operational amplifiers.

19. The filter circuit arrangement according to claim 9, comprising wherein one capacitor is provided per filter order.

20. An integrated circuit comprising:
    a filter circuit including a circuit configuration comprising a transistor having non-linear transmission characteristics for equalizing a magnetic disc writing or reading head input signal comprising negative and positive amplitudes present at an input node, a feedback loop comprising an integrator for providing a low pass filter, the circuit configuration having non-linear transmission characteristics being provided in an additional feedback loop coupled with the feedback loop, the additional feedback loop feeding back an output of the circuit configuration having non-linear transmission characteristics in subtractive form to the input node, the circuit configuration comprising the transistor having non-linear transmission characteristics being comprised in the feedback branch of the additional feedback loop to trim the negative and positive amplitudes of the magnetic disc writing or reading head input signal.

* * * * *